(12) United States Patent
Frayer et al.

(10) Patent No.: US 7,826,267 B2
(45) Date of Patent: Nov. 2, 2010

(54) METHOD AND APPARATUS FOR READING AND PROGRAMMING A NON-VOLATILE MEMORY CELL IN A VIRTUAL GROUND ARRAY

(75) Inventors: Jack Frayer, Boulder Creek, CA (US); Ya-Fen Lin, Saratoga, CA (US); Gianfranco Pellegrini, San Jose, CA (US); William Saiki, Mountain View, CA (US); Changyuan Chen, Sunnyvale, CA (US); Xiuhong Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 370 days.

(21) Appl. No.: 12/126,853

(22) Filed: May 23, 2008

(65) Prior Publication Data

US 2009/0290430 A1    Nov. 26, 2009

(51) Int. Cl.
*G11C 16/06* (2006.01)
(52) U.S. Cl. ............................. 365/185.16; 365/185.25; 365/185.13; 365/203
(58) Field of Classification Search ............ 365/185.16, 365/185.25, 185.13, 203
See application file for complete search history.

(56) References Cited

U.S. PATENT DOCUMENTS

| | | | |
|---|---|---|---|
| 6,430,077 B1 | 8/2002 | Eitan et al. | |
| 6,704,217 B2 | 3/2004 | Eitan | |
| 6,917,544 B2* | 7/2005 | Maayan et al. | 365/185.33 |
| 6,936,883 B2 | 8/2005 | Chen et al. | |
| 7,190,018 B2 | 3/2007 | Chen et al. | |
| 7,466,594 B2* | 12/2008 | Sofer et al. | 365/185.21 |
| 2004/0022092 A1* | 2/2004 | Dvir et al. | 365/200 |
| 2006/0280022 A1* | 12/2006 | Kono et al. | 365/230.03 |
| 2006/0285386 A1* | 12/2006 | Maayan | 365/185.13 |

* cited by examiner

*Primary Examiner*—Tuan T Nguyen
*Assistant Examiner*—Toan Le
(74) *Attorney, Agent, or Firm*—DLA Piper LLP ( US)

(57) ABSTRACT

A method and apparatus for dynamic programming and dynamic reading of a select non-volatile memory cell in a virtual grounds array is disclosed. In the dynamic read operation the global bit lines and the associated local bit lines are connected to a precharged voltage. One of the first or second global bit lines is connected to a low voltage such as ground, wherein the one global bit line connected to ground also connects to the local bit line for sensing the select non-volatile memory cell. The state of the select non-volatile memory cell is detected by detecting the sense amplifier connected to the global bit line, other than the one global bit line. In a dynamic programming operation, the first and second global bit lines and their associated local bit lines are precharged to a first voltage. One of the first or second global bit line and its associated local bit lines is connected to a second voltage.

22 Claims, 1 Drawing Sheet

METHOD AND APPARATUS FOR READING AND PROGRAMMING A NON-VOLATILE MEMORY CELL IN A VIRTUAL GROUND ARRAY

TECHNICAL FIELD

The present invention relates to a method and apparatus for reading and programming a select nonvolatile memory cell from a non-volatile memory cell array arranged in a virtual ground configuration.

BACKGROUND OF THE INVENTION

A non-volatile memory device having an array of non-volatile memory cells is well known in the art. A array of bidirectional non-volatile memory cells is also well known in the art. See for example, U.S. Pat. Nos. 6,936,883; and 7,190,018, assigned to the present assignee.

Virtual ground array of non-volatile memory cells is also well known in the art. See U.S. Pat. Nos. 6,704,217 and 6,430,077. A virtual ground array means that a terminal of a select non-volatile memory cell can be connected to either ground or to some other voltage depending upon the operation. In other words, the ground is not always connected to the same terminal in all operations. Hence the ground is "virtual". The type of non-volatile memory cell that can be formed in a virtual ground array can be any type, including but not limited to floating gate, trapping charge layer, SLC or MLC.

Heretofore, virtually ground arrays have suffered from two problems. These relate to the read operation and the programming operation.

SUMMARY OF THE INVENTION

Accordingly, in the present invention, a non-volatile memory device comprises a plurality of bi-directional non-volatile memory cells, each cell having three terminals: a first terminal, a second terminal, and a third terminal. The plurality of memory cells are arranged in a plurality of rows and columns with the first terminal of each cell in the same column connected to and sharing a first local bit line to one side, and with the third terminal of each cell in the same column connected to and sharing a second local bit line to another side, and with the second terminal of each cell in the same row connected to and sharing a common word line. The device also has a plurality of global bit lines. Alternating local bit lines in a row direction are connected to a first global bit line and other alternating local bit lines in the row direction are connected to a second global bit line. A sense amplifier is connected to the first and second global bit lines. A precharging means is provided to precharge the global bit lines and local bit lines to a precharged voltage. Means is also provided for connecting one of the first or second global bit lines to ground, wherein the one global bit line connected to ground also connects to the local bit line for sensing a select non-volatile memory cell.

The present invention also relates to methods for reading and programming the select non-volatile memory cell. In the method of reading a select cell, the global bit lines and local bit lines are precharged to a precharged voltage. One of the first or second global bit lines is connected to ground, wherein the one global bit line connected to ground also connects to the local bit line for sensing the select non-volatile memory cell. The state of the select non-volatile memory cell is detected by the sense amplifier connected to the global bit line, other than the one global bit line.

In one method of programming a select cell, the first and second global bit lines and their associated local bit lines are precharged to a first voltage. One of the first or second global bit line and its associated local bit lines is connected to a second voltage, wherein the associated local bit lines of the one global bit line include a select bit line connected to a programming terminal of the select non-volatile memory cell. Further, the voltage differential between the second voltage and the first voltage is insufficient to cause programming of the select non-volatile memory cell. The bit line, other than the select bit line of the select non-volatile memory cell is connected to ground. The voltage differential between the second voltage and ground is sufficient to cause programming of the select non-volatile memory cell.

In another method of programming a select cell, one of the global bit lines and its associated local bit lines are precharged to a first voltage. The associated local bit lines of the one global bit line include a select bit line connected to the first terminal for the select non-volatile memory cell to program the cell. The other of the global bit lines and its associated local bit lines is charged to a second voltage. The second voltage of the local bit lines associated with the other global bit line is capacitively coupled to the select bit line thereby boosting the first voltage to a third voltage. The other global bit line and its associated local bit lines are then disconnected from the third terminal of the select non-volatile memory cell. The third terminal of the select non-volatile memory cell is connected to ground. The voltage differential between the third voltage and ground is sufficient to cause programming of the select non-volatile memory cell.

DETAILED DESCRIPTION OF THE INVENTION

Figure 1:
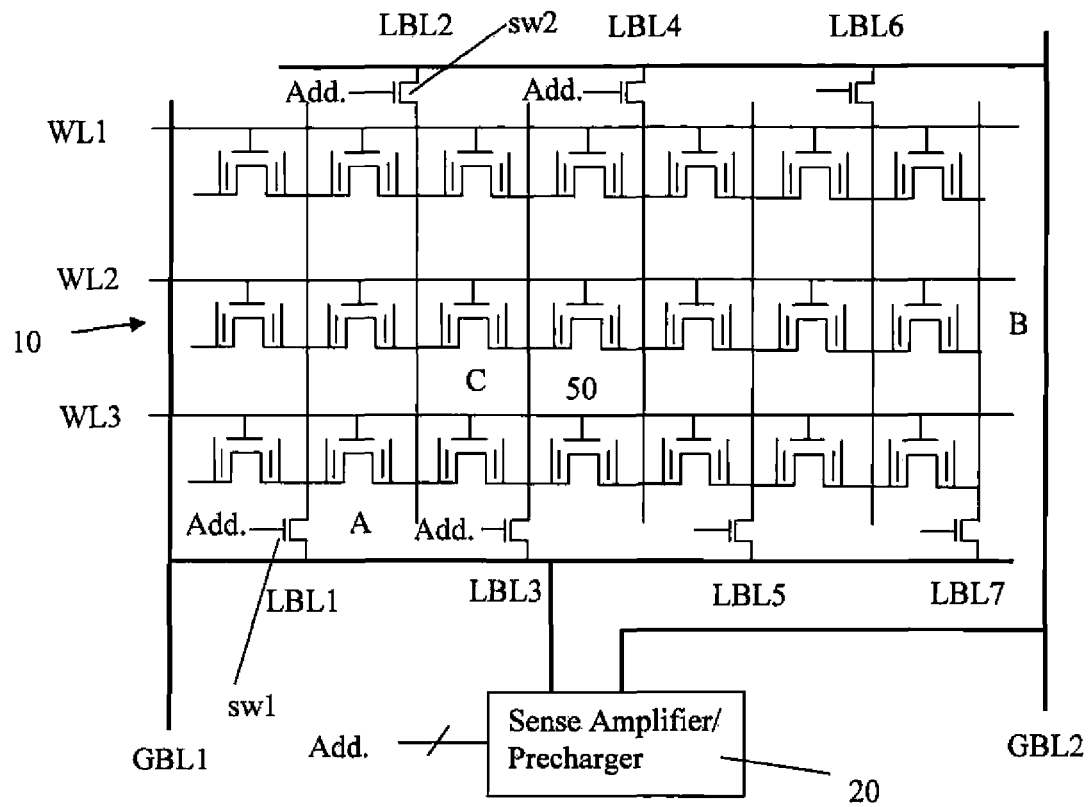
FIG. 1 is a schematic block level diagram of a memory device of the present invention.

Referring to FIG. 1, there is shown a block level diagram of a memory device 10 of the present invention. The device 10 comprises an array 50 of non-volatile memory cells. Each of the non-volatile memory cells can be of the floating gate type or trapping charge layer type as disclosed in U.S. Pat. Nos. 6,936,883; 7,190,018; 6,704,217 and 6,430,077, whose disclosures are incorporated by reference in their entirety. Further, each cell can be SLC or MLC. For purpose of illustrating the present invention, the device 10 is shown as comprising an array 50 of cells of the type disclosed in U.S. Pat. No. 6,936,883. However, it should be understood that the invention is not so limited.

Each of the memory cells in the array 50 is bi-directional and is of the type having a first terminal, a second terminal and a third terminal. The first terminal of cells in the same column are connected to and share the a first local bit line. The third terminal of cells in the same column are also connected to and share a second local bit line. Thus, cells in the column "A" all have their first terminals connected to the first local bit line designated LBL1 to one side, and have their third terminals connected to the second local bit line designated LBL2 to another side. Finally, all the cells in the same row have their second terminals connected to and share a common word line. Thus, the second terminals of the cells in the row "B" are all connected to the word line WL2.

Each alternating local bit lines in the row direction is connected to a first common global bit line through a switch, such as sw1, sw2 etc. Each of the switches sw1, sw2 etc is activated by an address signal. Thus, the local bit lines, designated as LBL1, LBL3, LBL5, and LBL7 are all connected, through their respective switches, to the global bit line designated GBL1. The other alternating local bit lines, in the row direction, namely, LBL2, LBL4, and LBL6 are all connected through their respective switches, to the other global bit line GBL2. As is well known in the art, the device 10 may have a plurality of arrays 50 on the same integrated circuit die. Thus, the global bit lines, GBL1 and GBL2, made out of metal, may be connected to the local bit lines of many arrays 50. The global bit lines GBL1 and GBL2 are also connected to a sense amplifier/precharger 20.

Figure 2:
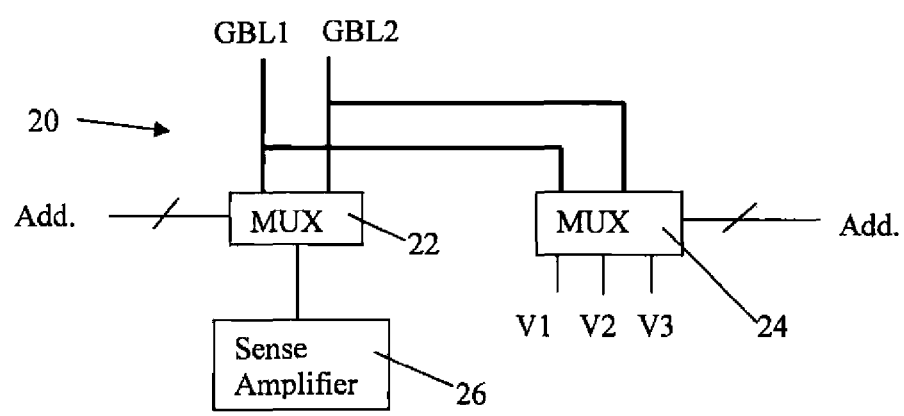
FIG. 2 is a detailed schematic block level diagram of a portion of the circuit shown in FIG. 1.

Referring to FIG. 2, there is shown in greater detail the sense amplifier/precharger 20. the sense amplifier/precharger 20 comprises a first MUX 22, which receives the global bit lines GBL1 and GBL2 as inputs and connects the output to a sense amplifier 26. the first MUX 22 is switched by address signals "ADD" supplied to the first MUX 22. Depending on the address signal ADD, either the first GBL1 or the second GBL2 is connected to the sense amplifier 28. The sense amplifier/precharger 20 also comprises a second MUX 24, which is also switched by the address signals ADD. The second MUX connects the GBL1 or GBL2 lines to a number of different voltages sources, V1, V2 and V3, such as ground etc. Because either the GBL1 or the GBL2 line can be connected to ground, the array 50 of the device 10 is a virtual ground array.

In the read method of the present invention, assume that cell C is to be read. Further, because each cell is bidirectional assume that the "left" portion of cell C is to be read. Then, in the method of the present invention, the switch sw2 connecting LBL2 to GBL2 is activated, and the switch connecting LBL3 to GBL1 is activated. Then, the global bit lines GBL1 and GBL2 are connected through second MUX 24 to a voltage source to bring the GBL1 and GBL2 lines to a precharge voltage. As is well known, the actual voltage to which the precharge voltage (which is the reading voltage) for cell "C" depends on the characteristics of the cell. However, for purpose of illustration, this may be at 2.5 volts. The GBL1 and GBL2 lines along with the associated local bit lines of LBL2 and LBL3 are brought to the precharged voltage of 2.5 volts. The switches, such as sw1, sw5 etc. connecting LBL1, LBL5, etc. to GBL1, and switches sw4, sw6 etc. connecting LBL4 and LBL6 etc. to GBL2 are not activated. Thus, the only local bit lines LBL connected to the global bit lines GBL are LBL2 and LBL3. All other local bit lines are not precharged. Once the precharge voltage is reached, then GBL1 and GBL2 lines and the associated LBL2 and LBL3 lines are disconnected from the 2.5 voltage source by the MUX 24 and are left in a "float" state.

Assume further that the characteristics of the cell C is such that for reading the "left" side of cell C the local bit line LBL2 must be brought to ground (or it could be a slightly positive voltage, such as between 0-1.0 volts, as disclosed in U.S. Pat. No. 6,936,883), then GBL2 is connected to ground (or the slightly positive voltage). Thus, switch sw2 is activated connecting LBL2 to GBL2 to ground (or the slightly positive voltage) in MUX 24. In addition, GBL1 is connected through first MUX 22 to the sense amplifier 26. Switch sw3 is activated connecting LBL3 to GBL1 through MUX 22 to sense amplifier 26. Since the GBL1 and LBL3 lines have the precharge voltage on them, the charges on those lines are permitted to pass through cell C and the current is detected by the sense amplifier 26. Of course, the associated word line WL2 must also be activated so that charges from GBL1 and LBL3 can pass through the channel region of the portion over which WL2 operates. In this manner, reading is accomplished that is fast and is dynamic. Of course, to read the "right" portion of cell C, the connection of GBL1 and GBL2 to ground are reversed.

In one variation of the method of reading of the present invention, in the event the amount of "charges" stored on the floating bit lines (GBL1 and LBL3) is insufficient to be detected by the sense amplifier 28, then during the precharge step, all of the LBLs associated with the GBL1 are connected to the GBL1 and are precharged. Thus, during the precharge step, LBL1, LBL3, LBL5, and LBL7 are also precharged. While this increases the amount of charges available to be sensed, it is not desirable because all those charges on those bit lines must eventually be all discharged.

In a first method of programming a select non-volatile memory cell of the present invention, the GBL1 and GBL2 global lines are first precharged to a programming first voltage, such as +5 volts. Assuming that the "left" portion of cell C is to be programmed, and as disclosed in U.S. Pat. No. 6,936,883, the LBL2 should be supplied with about 10-15 volts, LBL3 should be supplied with about 2-5 volts, and WL2 should be supplied with about 1-2 volts. After GBL1 and GBL2, including LBL2 and LBL3 are precharged to about +5 volts, GBL2 is raised to about 10-15 volts. In addition, sw2 is activated connecting LBL2 to the voltage on GBL2. After GBL2 and LBL2 are precharged to about 10-15 volts, GBL2 is disconnected from the 10-15 volt source. In addition, sw2 may also be deactivated, disconnecting LBL2 from GBL2. The difference between 10-15 volts on LBL2 and +5 volts on LBL3 is insufficient to cause the programming of the floating gate in the "left" portion of cell C. GBL1 is lowered to about 1-2 volts, and sw3 is activated connecting LBL3 to GBL1. Finally, WL2 is supplied with about 1-2 volts. Thus, the voltages supplied to cell C is sufficient to cause the programming of the floating gate on the "left" portion of cell C.

In an alternative method of programming a select non-volatile memory cell of the present invention, it is assumed again that the "left" portion of cell C is to be programmed. The voltages necessary to program the "left" portion of the floating gate of cell C are set forth hereinabove. GBL2 and LBL2 are connected to a voltage source of about +5 volts precharging the LBL2. Of course, sw 2 must be activated to connect LBL2 to GBL2. All other switches from LBLs to GBL2 are disconnected. After LBL2 is precharged to +5 volts, sw2 is deactivated disconnecting LBL2 from GBL2. GBL1 is then connected to +10 volts. All the switches connecting all of the LBLs to GBL1 are activated connecting all the LBLs such as LBL1, LBL3, LBL5 etc. to GBL1. When all such LBLs are connected to +10 volts, they are capacitively coupled to LBL2 boosting it to a higher voltage, such as +12 volts. Thereafter, LBL3 is connected through sw3 to GBL1 to a fourth voltage, such as 1-2 volts. LBL3 is then disconnected from GBL1, and is left floating. WL2 is then supplied with about 1-2 volts sufficient to turn on the channel of cell C. The difference between +12 volts on LBL2 and 1-2 volts on LBL3 is sufficient to cause programming of the left portion of cell C.

There are a number of variation of the alternative method of programming of the present invention. First, the steps of precharging LBL2 to +5 volts and thereafter capacitively charging the other LBLs to boost the voltage on LBL2 can be reversed. In other words, all the switches connecting all of the LBLs to GBL1 are activated first connecting all the LBLs such as LBL1, LBL3, LBL5 etc. to GBL1. After all such LBLs are connected to +10 volts, then LBL2 may be connected to GBL2 to a source of +5 volts, thereby boosting the voltage on LBL2.

What is claimed is:

1. A method of reading a select non-volatile memory cell from an array of such non-volatile memory cells arranged in a plurality of rows and columns, wherein each cell in the same column share a first local bit line to one side and share a second local bit line to another side, wherein alternating local bit lines are connected to a first global bit line and other alternating local bit lines are connected to a second global bit line with the global bit lines connected to a sense amplifier, said method comprising:
   precharging said global bit lines and local bit lines to a precharged voltage;
   connecting one of said first or second global bit lines to a lower voltage, wherein said one global bit line connected to the lower voltage also connects to the local bit line for sensing the select non-volatile memory cell; and
   detecting the state of the select non-volatile memory cell by detecting the sense amplifier connected to the global bit line, other than the one global bit line.

2. The method of claim 1 wherein each of the non-volatile memory cells is a bi-directional floating gate non-volatile memory cell.

3. The method of claim 1 wherein each of the non-volatile memory cells is a bi-directional trapping charge layer non-volatile memory cell.

4. The method of claim 2 wherein said non-volatile memory cell is a MLC non-volatile memory cell.

5. The method of claim 3 wherein said non-volatile memory cell is a MLC non-volatile memory cell.

6. The method of claim 1 wherein each of the local bit lines is connectable to one of said global bit lines through a switch.

7. The method of claim 4 further comprising:
   activating the switch to connect the local bit line to its associated global bit line for all the local bit lines during the precharging step; and
   deactivating the switch to disconnect all local bit lines to their associated global bit lines except for the local bit line for sensing the select non-volatile memory cell, after the precharging step.

8. The method of claim 1 wherein each of said non-volatile memory cells in the same row share a common word line.

9. The method of claim 8 further comprising:
   activating the word line connected to the select non-volatile memory cell prior to the detecting step.

10. The method of claim 1 wherein the lower voltage is ground.

11. A non-volatile memory device comprising:
   a plurality of bi-directional non-volatile memory cells, each cell having three terminals: a first terminal, a second terminal, and a third terminal;
   said plurality of memory cells arranged in a plurality of rows and columns with the first terminal of each cell in the same column connected to and sharing a first local bit line to one side, and with the third terminal of each cell in the same column connected to and sharing a second local bit line to another side, and with the second terminal of each cell in the same row connected to and sharing a common word line;
   a plurality of global bit lines;
   alternating local bit lines in a row direction are connected to a first global bit line and other alternating local bit lines in the row direction are connected to a second global bit line;
   a sense amplifier connected to the first and second global bit lines;
   precharging means for precharging said global bit lines and local bit lines to a precharged voltage; and
   means for connecting one of said first or second global bit lines to ground, wherein said one global bit line connected to ground also connects to the local bit line for sensing a select non-volatile memory cell.

12. The device of claim 11 further comprising:
   each local bit line is connected to the first global bit line or the second global bit line as the case may be through a switch.

13. The device of claim 12 wherein each of the non-volatile memory cells is a bi-directional floating gate non-volatile memory cell.

14. The device of claim 12 wherein each of the non-volatile memory cells is a bi-directional trapping charge layer non-volatile memory cell.

15. The device of claim 13 wherein said non-volatile memory cell is a MLC non-volatile memory cell.

16. The device of claim 14 wherein said non-volatile memory cell is a MLC non-volatile memory cell.

17. A method of programming a select non-volatile memory cell from an array of such non-volatile memory cells arranged in a plurality of rows and columns, wherein each cell in the same column share a first local bit line to one side and share a second local bit line to another side, wherein said select non-volatile memory cell is programmed by applying a voltage differential between a first local bit line and a second local bit line, and wherein alternating local bit lines are connected to a first global bit line and other alternating local bit lines are connected to a second global bit line, said method comprising:
   (a) precharging said first and second global bit lines and their associated local bit lines to a first voltage;
   (b) connecting one of said first or second global bit line and its associated local bit lines to a second voltage, wherein said associated local bit lines of said one global bit line include a select bit line connected to a programming terminal of the select non-volatile memory cell, wherein the voltage differential between said second voltage and said first voltage is insufficient to cause programming of said select non-volatile memory cell; and
   (c) connecting the bit line, other than the select bit line of the select non-volatile memory cell to a third voltage, wherein the voltage differential between said second voltage and the third voltage is sufficient to cause programming of said select non-volatile memory cell.

18. The method of claim 17 further comprising:
   disconnecting the one of said first or second global bit line and its associated local bit lines to the second voltage, immediately prior to connecting step (c).

19. The method of claim 17 wherein the connecting step (b) connects one of the global bit line to the second voltage and wherein the method further comprising:
   disconnecting the one global bit line from the select local bit line prior to the connecting step (c).

20. A method of programming a select non-volatile memory cell from an array of such non-volatile memory cells arranged in a plurality of rows and columns, wherein each cell having a first terminal, a second terminal and a third terminal, with the first terminal of each cell in the same column connected to and sharing a first local bit line to one side, and with the third terminal of each cell in the same column connected to and sharing a second local bit line to another side, and with the second terminal of each cell in the same row connected to and sharing a common word line, wherein said select non-volatile memory cell is programmed by applying a voltage differential between its first terminal and its third terminal, and wherein alternating local bit lines are connected to a first global bit line and other alternating local bit lines are connected to a second global bit line, said method comprising:

(a) charging one of said global bit lines and its associated local bit lines to a first voltage, said associated local bit lines of said one global bit line include a select bit line connected to the first terminal for said select non-volatile memory cell to program said cell;

(b) charging the other of said global bit lines and its associated local bit lines to a second voltage, wherein said second voltage of the local bit lines associated with said other global bit line being capacitively coupled to said select bit line boosting said first voltage to a third voltage;

(c) disconnecting said other global bit line and its associated local bit lines from said third terminal of the select non-volatile memory cell; and (d) connecting said third terminal of the select non-volatile memory cell to a fourth voltage, wherein the voltage differential between the third voltage and the fourth voltage is sufficient to cause programming of said select non-volatile memory cell.

21. The method of claim 20 wherein said charging step (a) precedes the charging step (b).

22. The method of claim 20 wherein said charging step (b) precedes the charging step (a).

* * * * *